(12) United States Patent
Fumitake et al.

(10) Patent No.: US 8,753,956 B2
(45) Date of Patent: Jun. 17, 2014

(54) SEMICONDUCTOR STRUCTURE AND FABRICATION METHOD

(71) Applicants: Mieno Fumitake, Shanghai (CN); Meisheng Zhou, Shanghai (CN)

(72) Inventors: Mieno Fumitake, Shanghai (CN); Meisheng Zhou, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/724,284

(22) Filed: Dec. 21, 2012

(65) Prior Publication Data
US 2013/0334607 A1 Dec. 19, 2013

(30) Foreign Application Priority Data
Jun. 19, 2012 (CN) .......................... 2012 1 0203744

(51) Int. Cl.
*H01L 21/76* (2006.01)
*H01L 21/762* (2006.01)
*H01L 29/06* (2006.01)

(52) U.S. Cl.
CPC ....... *H01L 21/76229* (2013.01); *H01L 29/0649* (2013.01)
USPC ............ 438/427; 438/296; 257/374; 257/353

(58) Field of Classification Search
CPC ..................... H01L 21/76229; H01L 29/0649
USPC ........................... 438/427, 296; 257/374, 353
See application file for complete search history.

(56) References Cited

U.S. PATENT DOCUMENTS

| 6,727,150 B2 * | 4/2004 | Tang .............................. 438/296 |
| 2011/0068431 A1 | 3/2011 | Knorr et al. |

* cited by examiner

*Primary Examiner* — Tu-Tu Ho
(74) *Attorney, Agent, or Firm* — Anova Law Group, PLLC

(57) ABSTRACT

A method is provided for fabricating a semiconductor structure. The method includes providing a semiconductor substrate having a first region and an adjacent second region, and etching the semiconductor substrate to form a plurality of first trenches in the first region and a second trench in the second region. Fins are formed in between the adjacent first trenches. The width of the second trench is greater than the width of the first trench. The method also includes filling the first trenches with a first isolation material to form first insolation structures, and form sidewall spacers inside the second trench. Further, the method includes forming a third trench in the second trench by etching the exposed semiconductor substrate on the bottom of the second trench using the sidewall spacers as an etching mask, and filling the second trench and the third trench using a second isolation material to form a second isolation structure.

20 Claims, 6 Drawing Sheets

SEMICONDUCTOR STRUCTURE AND FABRICATION METHOD

CROSS-REFERENCES TO RELATED APPLICATIONS

This application claims the priority of Chinese patent application No. 201210203744.4, filed on Jun. 19, 2012, the entirety of which is incorporated herein by reference.

FIELD OF THE INVENTION

The present invention generally relates to the field of semiconductor manufacturing technology and, more particularly, relates to semiconductor structures and techniques for fabricating high performance semiconductor structures.

BACKGROUND

With the rapid development on the semiconductor process technology, the process node continues to shrink, and a gate-last process is widely used to obtain a desired threshold voltage and to improve the device performance. However, when the critical dimension (CD) is further reduced, the conventional structure of MOSFETs can no longer match the requirements of the desired device performance even when the gate-last process is used. Therefore, multiple-gate devices have attracted extensive attentions as the substitutes of the conventional devices.

The fin field-effect transistor (Fin FET) is a typical multiple-gate device. FIGS. 1-4 illustrate an existing fabrication process of a Fin FET.

As shown in FIG. 1, a semiconductor substrate 100 having a first region I and a second region II is provided. A first hard mask layer 101 is formed on one surface of the semiconductor substrate 100, and the first hard mask layer 101 in the second region II has a first opening 102. Then a first trench 103 is formed by etching a portion of the semiconductor substrate 100 corresponding to the first opening 102.

As shown in FIG. 2, a first isolation material (not shown) is formed onto the hard mask layer 101 to completely fill the first opening 102 and the first trench 103. Further, the first isolation material and the first mask 101 are removed by a chemical mechanical polishing (CMP) process using the surface of the semiconductor substrate 100 as a stop layer, i.e., the CMP process is stopped when it reaches the surface of the semiconductor substrate. Thus a first isolation structure 104 is formed to isolate adjacent source regions.

Further, as shown in FIG. 3, a second hard mask layer 105 is formed on the surface of the semiconductor substrate 100. The second hard mask layer has a plurality of second openings 106. Then an etching process is performed onto the semiconductor substrate 100 corresponding to the second openings 106, a plurality of fins 108 are thus formed. There are a plurality of second trenches 107 in between the adjacent fins 108 and also in between the fins 108 and the semiconductor substrate 100. The position of the second trenches is corresponding to the second openings 106, and the depth of the second trench 107 is smaller than the depth of the first trench 103.

And further, as shown in FIG. 4, a second isolation material (not shown) is formed onto the second hard mask layer 105. The second openings 106 and the second trenches 107 are completely filled. Further, a CMP process is performed to remove the second isolation material and the second mask layer 105; a plurality second isolation structure 109 are thus formed inside the second trenches 107 to electrically isolate the adjacent fins 108.

According to the described structure and fabrication process, the existing method for forming Fin FETs is relatively complex. For example, because the depth of the first isolation structure 104 is greater than the depth of the second isolation structure 109, in order to form the first isolation structure 104 and the second isolation structure 109, two separate hard mask layers, the first mask layer 101 and the second hard mask layer 105, are used. The disclosed device structures, methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having a first region and an adjacent second region, etching the semiconductor substrate to form a plurality of first trenches in the first region and a second trench in the second region, fins are formed in between the adjacent first trenches. The method also includes filling the first trenches using a first insolation material to form first insolation structures, and filling the second regions at the same time to form sidewall spacers. The method also includes etching the exposed semiconductor substrate on a bottom of the second trench using the sidewall spacers as an etching mask to form a third trench. Further, the method includes filling the second trench and the third trench using a second insolation material to form a second insolation structure.

Another aspect of the present disclosure includes a semiconductor structure. The semiconductor structure includes a semiconductor substrate having a first region and an adjacent second region. The semiconductor structure also includes a plurality of first isolation structures, and a plurality of fins formed in between the adjacent first isolation structures. Further, the semiconductor includes at least one second isolation structure and sidewall spacers Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
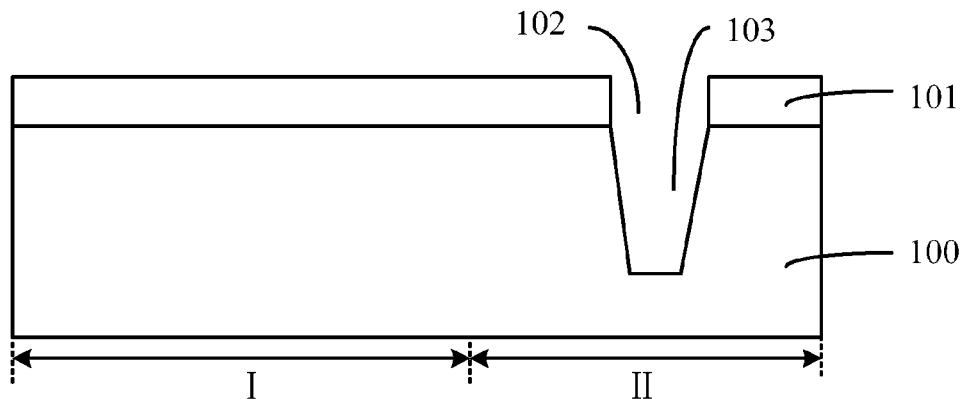
FIGS. 1-4 illustrate semiconductor structures corresponding to certain stages of an exemplary existing fabrication process.
Figure 2:
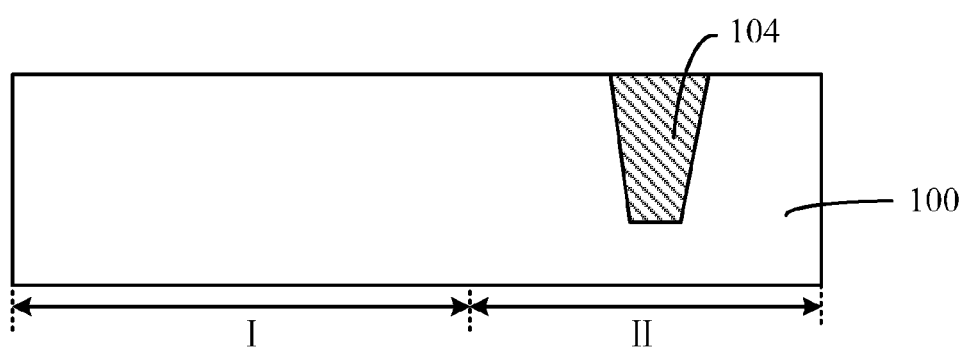
Figure 3:
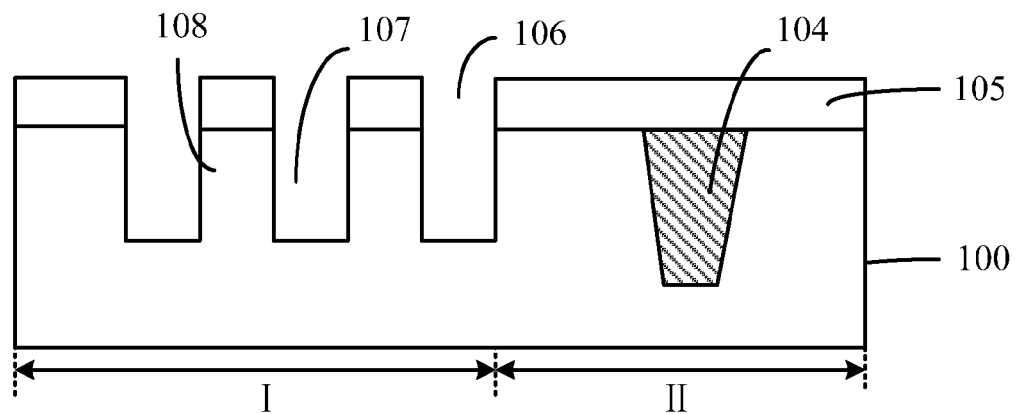
Figure 4:
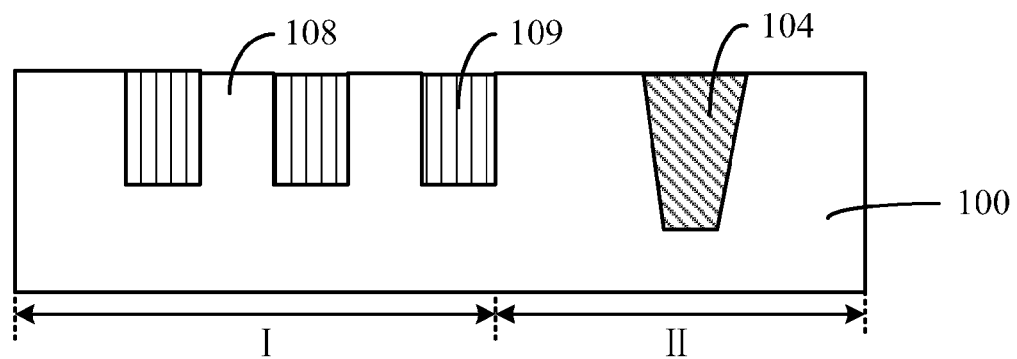
Figure 5:
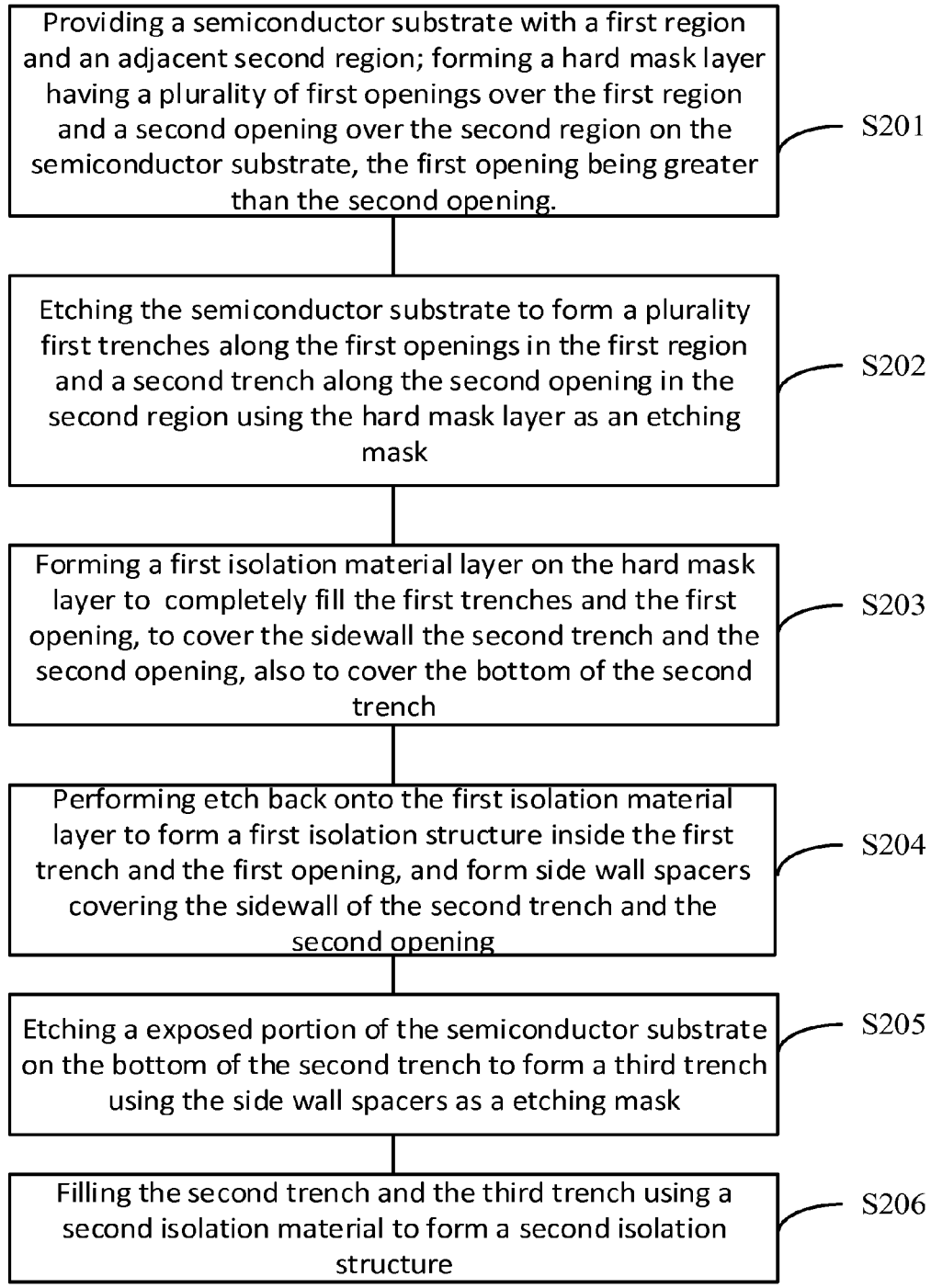
FIG. 5 illustrates an exemplary fabrication process of a semiconductor device consistent with the disclosed embodiments.

To describe the disclosed semiconductor structures and fabrication methods, FIG. 5 illustrates an exemplary fabrication process of a semiconductor device, and FIGS. 6-11 illustrate exemplary semiconductor structures corresponding to various stages of the fabrication process.

Figure 6:
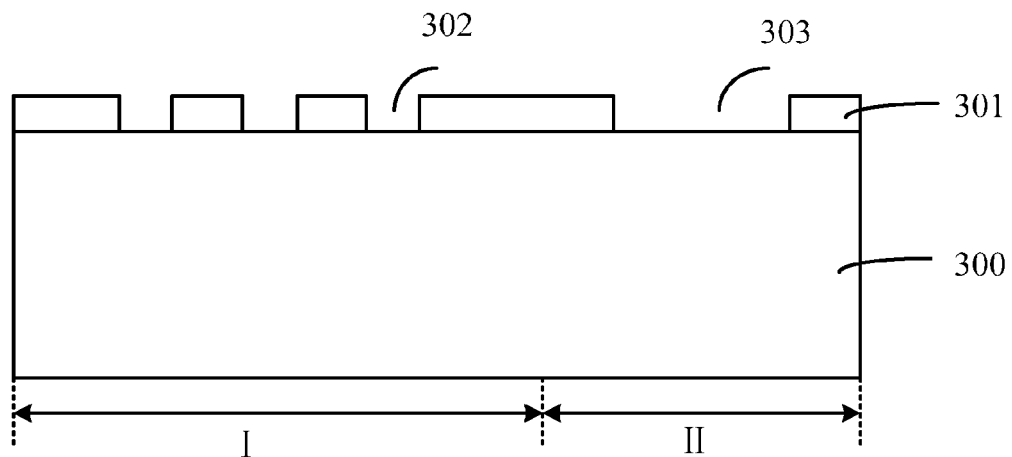
FIGS. 6-11 illustrate semiconductor structures corresponding to certain stages of the fabrication process consistent with the disclosed embodiments.

As shown in FIG. 5, at the beginning of the fabrication process, a semiconductor substrate is provided (S201). The substrate may have a first region and an adjacent second region. A hard mask layer may be formed on the substrate. The hard mask layer over the first region may have a plurality of first openings, and the hard mask layer over the second region may have a second opening. The width of the second opening may be greater than the width of the first opening. FIG. 6 illustrates a corresponding semiconductor structure.

As shown in FIG. 6, a semiconductor substrate 300 is provided. The substrate 300 may include any appropriate semiconductor materials, such as silicon, silicon on insulator (SOI), silicon germanium, carborundum, indium antimonide, lead telluride, indium arsenide, indium phosphide, gallium arsenidie or gallium antimonite, ally semiconductor or a combination thereof. In one embodiment, the semiconductor substrate is silicon. Further, the semiconductor substrate has a first region I and an adjacent second region II. The substrate 300 provides a base for subsequent processes and structures.

A hard mask layer 301 may be formed on one surface of the semiconductor substrate 300. The term hard mask may refer to a material used in the semiconductor processing as an etch mask in lieu of polymer or other organic "soft" resist materials. The hard mask layer may be made of any appropriate materials, such as silicon nitride, siliconoxynitride, siliconoxycarbide, amorphous carbon and carbonsiliconoxynitride, etc. In one embodiment, the hard mask layer 301 is silicon nitride.

The hard mask layer 301 may be formed by various ways, such as a chemical vapor deposition (CVD) process, a physical vapor deposition (PVD) process and thermal, or a thermal oxidation process, etc. A plurality of first openings 302, i.e., exposure area, may be formed in the hard mask layer 301 in the first region I, and a second opening 303 may be formed in the hard mask layer 301 in the second region II. These openings 302 and 303 may be formed by an etching process such as a plasma etching process, an ion beam etching process, or a wet chemical etching process, etc. The first openings 302 may correspond to later-formed first trenches in the substrate 300 and the second opening 303 may correspond to later-formed second trench in the substrate 300. The width of the second opening 303 is greater than the width of the first opening 302.

Figure 7:
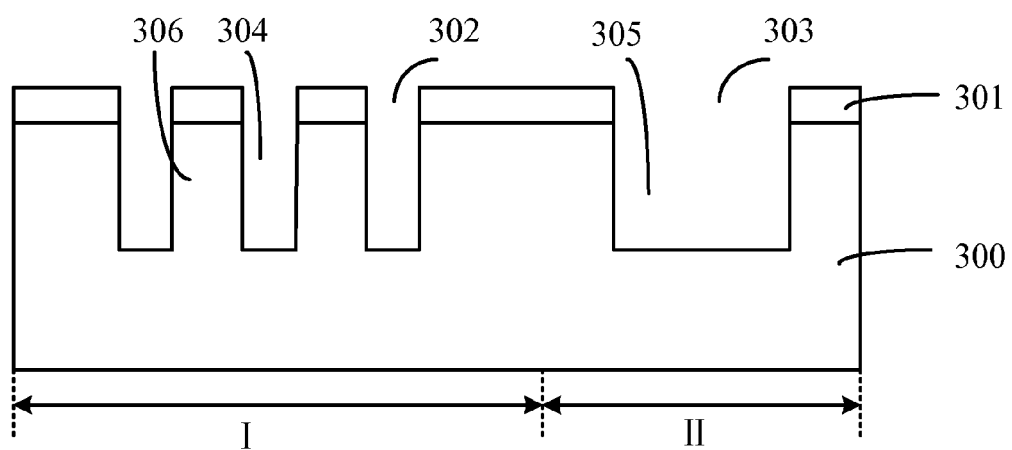

Returning to FIG. 5, after forming the first openings 302 and the second opening 303, a plurality of first trenches corresponding to the first openings 302 and a second trench corresponding to the second opening 303 may be formed by an etching process using the hard mask layer 301 as an etching mask, i.e., the area of the substrate 300 corresponding to the opening 302 and the opening 303 of the hard mask 301 may be etched (S202). FIG. 7 illustrates a corresponding semiconductor structure.

As shown in FIG. 7, a plurality of first trenches 304 and a second trench 305 are formed in the substrate 300. The first trenches 304 and the second trench 305 may be formed by any appropriate etching process such as a plasma etching process, an ion beam etching process, or a wet chemical etching, etc. Fins 306 may be formed by the plurality of first trenches 304, i.e., the structures in between the adjacent trenches 304 may form fins 306, which may be used to form Fin FETs. The width of the second trench 305 is greater than the width of the first trenches 304. For example, the width of individual first trenches 304 may be approximately 10 nm~50 nm, and the width of the second trench 305 may be approximately 50 nm~500 nm.

Further, the trenches 304 and the trench 305 may be formed in various ways. For example, the trenches 304 and the trench 305 may be formed separately by different etching processes. In certain embodiments, the trenches 304 and the trench 305 may be formed by one etching process. The depth of the trench 304 and the depth of the trench 305 may be same. For example, the depth of the first trenches 304 may be approximately 50~300 nm, and the depth of the second trench 305 may also be approximately 50~300 nm.

Sidewalls of the first trench 304 and the second trench 305 may be a vertical sidewall, i.e., the angle between the sidewall and the surface of the semiconductor substrate 300 may be approximately 90°, or a sloped sidewall, i.e., the angle between the sidewall and the surface of the semiconductor substrate 300 may be less than approximately 89°. A sloped sidewall may also refer that the top width of the first trench 304 and the first trench 305 is greater than the bottom width of the first trench 304 and the second trench 305, and the width of the sloped sidewall may refer to the maximum width of the first trench 304 and the second trench 305, i.e. the top width. In one embodiment, the sidewall is the vertical sidewall. In another embodiment, the angle between the sidewall and the semiconductor substrate 300 may be approximately 80°~89°, which may facilitate the subsequent formation of a first isolation material layer inside the first trench 304 and the second trench 305.

Certain etching process may be used to form the vertical sidewall of the trench 305. For example, a plasma etching process may be used to form the vertical sidewall of the trench 305. The power of the plasma etching process may be set in a range of approximately 550~650 W; the bias power may be set in a range of approximately 55~60 W; the chamber pressure may be set in a range of approximately 2~10 mTorr, and the etching gas may be a mixture of any or all of $CH_2F_2$, $SF_6$, $N_2$ and He. When the sidewall of the second trench 305 is a vertical sidewall and the first trenches 304 are formed simultaneously with the second trench 305, the sidewalls of the first trenches 304 may also be vertical sidewalls.

Certain etching process may be used to form the sloped sidewall of the second trench 305. For example, a plasma etching process may be used to form the sloped sidewall of the second trench 305. The power of the plasma etching process may be set in a range of approximately 1100~1250 W; the bias power may be set in a range of approximately 200~220 W; the chamber pressure may be set in a range of approximately 10~20 mTorr; and the etching gas may be a mixture of any or all of HBr, $SF_6$, and He. Similarly, when the sidewall of the second trenches 305 is a sloped sidewall, and the first trenches 304 are formed simultaneously with the second trench 305, the sidewalls of the first trenches 304 may be also sloped sidewalls, which may increase the surface area of the fins 306.

Additionally or optionally, after forming the first trenches 304 and the second trench 305, a thermal oxidation process may be performed to form an oxide liner layer covering on the sidewalls of the trenches 304 and the trench 305. The oxide liner layer may be used to reduce the damage of the subsequent process.

Figure 8:
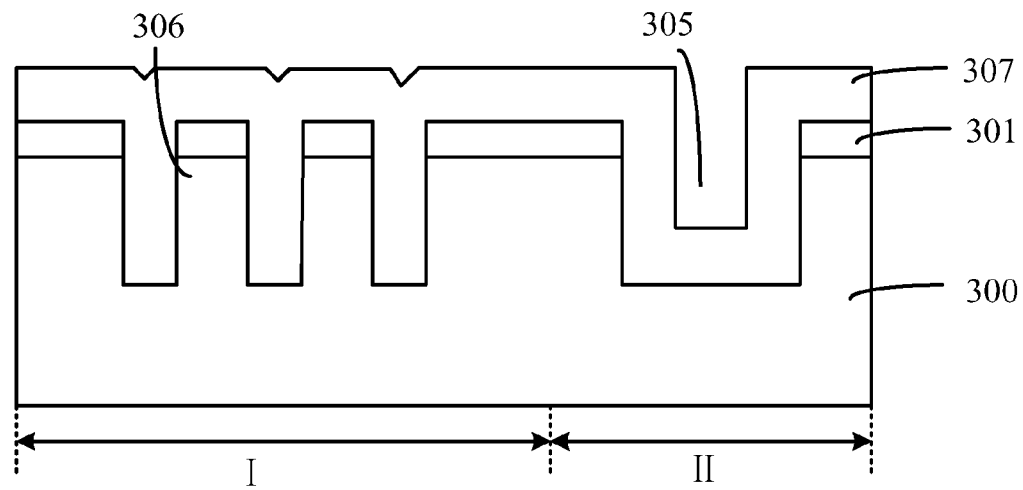

Returning to FIG. 5, after forming the first trenches 304 and the second trench 305, a first isolation material layer may be formed on the top of the hard mask 301 (S203). The first isolation material layer may completely fill the first trenches 304 in the substrate 300 and the first openings 302 of the hard mask 301. The first isolation material layer may cover the sidewall and bottom of the second trench 305, and may also cover the sidewall of the second opening 303. FIG. 8 illustrates a corresponding semiconductor structure.

As shown in FIG. 8, an isolation material layer 307 is formed on the top of the hard mask layer 301. The isolation material layer 307 completely fills the first trenches 304 and the first openings 302. Because the width of the second trench 305 is greater than the width of the first trenches 304, the first isolation material layer 307 may be unable to fill the second trench 305 and may only cover the sidewall and the bottom of the second trench 305 and the sidewall of the second opening 303.

The isolation material layer 307 may include any appropriate material, such as silicon dioxide and/or silicon nitride, etc. In one embodiment, the isolation material layer 307 is silicon dioxide, and the isolation material layer 307 may be formed using an atomic layer deposition (ALD) process. Other processes, such as a flowable chemical vapor deposition process (FCVD), may also be used.

Figure 9:
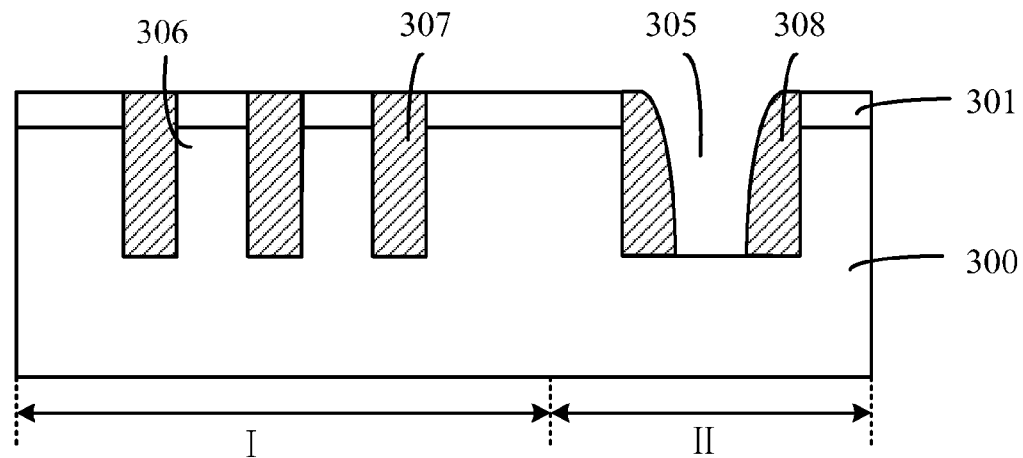

Returning to FIG. 5, after forming the isolation material layer 307, an etch back process may be performed to remove a portion of the isolation material layer 307. The remaining part of the isolation material layer 307 inside the first opening 302 and the first trenches 304 form first isolation structures. The remaining part of the isolation material layer 307 covering the sidewall of the second opening 303 and the second trench 305 form a sidewall spacer which may also be used as a portion of a later formed isolation structure (S204). FIG. 9 illustrates a corresponding semiconductor structure.

As shown in FIG. 9, an etch back process, i.e., etching the deposited first isolation material layer 307, is performed onto the isolation materials layer 307. The portion of isolation material 307 on top of the hard mask 301 is removed. The remaining parts of the isolation material layer 307 inside trenches 304 form a plurality of isolation structures, which may refer as isolation structures 307. The isolation structures 307 isolate the adjacent fins 306. At the both ends of the fins structures 306, the isolation structures 307 also isolate the fins 306 from the semiconductor substrate 300.

Further, the portion of isolation material 307 on the bottom of the second trench 305 is also removed. The remaining parts of the isolation material layer 307 covering the sidewalls of the second trench 305 and the second opening 303 are etched back to form sidewall spacers 308. The sidewall spacer 308 may be used as a mask to subsequently form a third trench. The sidewall spacer 308 may also be a portion of a later formed second isolation structure.

Certain etching process may be used as the etch back process, such as a plasma etching process, an ion beam etching process, or a wet etching process. The etch back process may be stopped when the portion of the first isolation material layer 307 above the hard mask layer 301 is completely removed.

Figure 10:
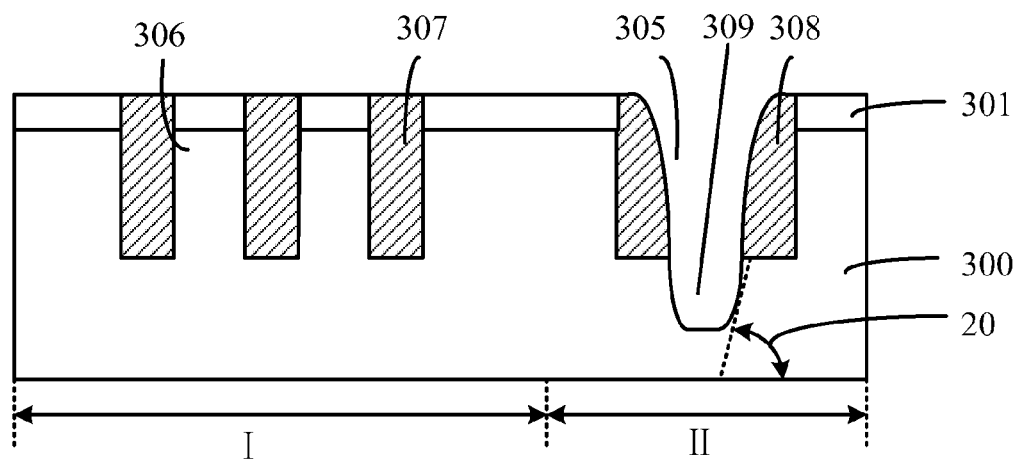

Returning to FIG. 5, after forming the isolation structures 307 and the sidewall spacer 308, a third trench may be formed by etching the exposed semiconductor substrate 300 locating on the bottom of the second trench 305 using the sidewall spacer 308 as an etching mask. FIG. 10 illustrates a corresponding semiconductor structure.

As shown in FIG. 10, a third trench 309 is formed by etching the exposed semiconductor substrate 300 locating on the bottom of the second trench 305 using the sidewall spacer 308 as an etching mask.

The sidewall of the third trench 309 may be a vertical sidewall, i.e., the angle between the sidewall and the surface of the semiconductor substrate 300 may be approximately 90°, or a sloped sidewall, i.e., the angle between the sidewall and the surface of the semiconductor substrate 300 may be less than approximately 90°. A sloped sidewall may also refer that the top width of the third trench 309 is greater than the bottom width of the third trench 309, and the width of the sloped sidewall may refer to the maximum width of the third trench 309, i.e. the top width. In one embodiment, the sidewall of the third trench 309 is a sloped sidewall.

The angle 20 between the sloped sidewall and the surface of the semiconductor substrate 300 may be in a range approximately of 40°~89°. For example, the angle 20 may be approximately 45°, 50°, 60°, 70°, or 80°. When one or more of 45°, 50°, 60°, 70°, 80° is selected, it may be less likely to form interstitial defects when a second isolation material is formed inside the third trench 309 in the subsequent process. The width of the third trench 309 is smaller than the width of the second trench 305. For example, the width of the third trench 309 may be approximately 50~450 nm, and the width of the second trench 305 may be approximately 50~500 nm. The depth of the third trench may be approximately 50~300 nm.

Certain etching process may be used to form the vertical sidewall of the third trench 309. For example, a plasma etching process may be used to form the vertical side wall of the trench 309. The source power of the plasma etching process may be set in a range of approximately 550~650 W; the bias power may be set in a range of approximately 55~65 W; the etching chamber pressure may be set in a range of approximately 2~10 mTorr, and the etching gas may be a mixture of any or all of $CH_2F_2$, $SF_6$, $N_2$ and He.

Certain etching process may be used to form the sloped sidewall of the third trench 309. For example, a plasma etching process may be used to form the sloped sidewall of the third trench 309. The source power of the plasma etching process may be set in a range of approximately 1100~1250 W; the bias power may be set in a range of approximately 220~220 W; the etching chamber pressure may be set in a range of approximately 10~20 mTorr; and the etching gas may be a mixture of any or all of HBr, $SF_6$ and He.

Additionally or optionally, after forming the trench 309, a liner layer may be formed on the sidewalls of the third trench 309. The liner layer may be made of any appropriate isolation materials such as silicon dioxide or silicon nitride, etc. The liner layer may be formed by a chemical vapor deposition process or a thermal oxidation process. The thickness of the liner layer may be approximately 3~20 nm. The liner layer may be used to reduce damages of the subsequent process.

Figure 11:
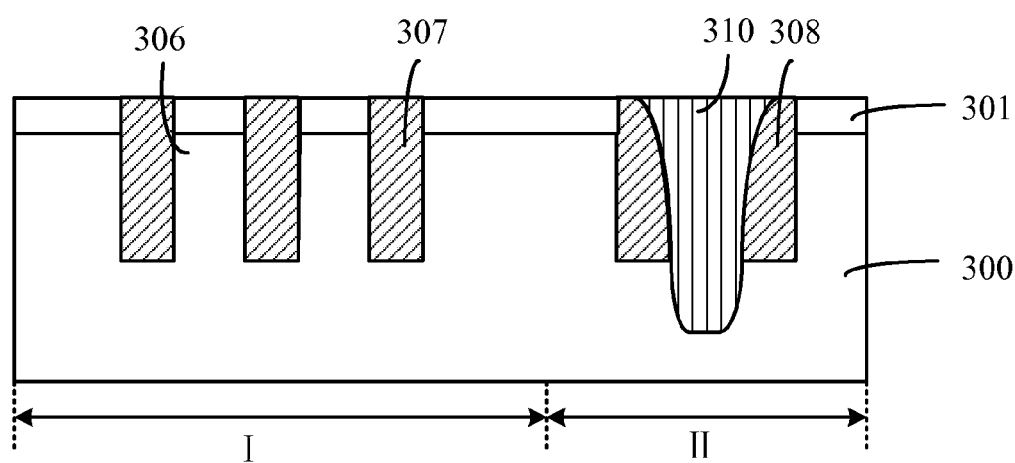

Returning to FIG. 5, after forming the third trench 309, a second isolation structure may be formed by filling the second trench 305 and the third trench 309 with a second isolation material (S206). FIG. 11 illustrates a corresponding semiconductor structure.

As shown in FIG. 11, a second isolation structure 310 is formed inside the second trench 305 and the third trench 309. The second isolation structure 310 may be formed by depositing a second isolation material on the top of the hard mask layer 301 and the top of the first isolation structures 307, and completely filling the second trench 305 and the third trench 309.

The second isolation structure 310 may be formed by various ways, such as a high density plasma chemical vapor deposition (HDP CVD) process or a sub-atmospheric pressure chemical vapor deposition (SACVD) process. When a low frequency HDP CVD process is used, the power of the HDP CVD process may be less than 5000 W. When a high frequency HDP CVD process is used, the power of the HDP CVD process may be less than 3500 W. The pressure of the HDP CVD process may be less than 10 mTorr. The temperature may be approximately 500° C.~1000° C. The deposition gas may be a mixture of any or all of $SH_4$ and $O_2$. When a SACVD process is used, the pressure of the SACVD process may be approximately 500~700 Torr. The temperature of the SACVD process may be approximately 500° C.~600° C. The deposition gas of the SACVD process may be a mixture of any or all of TEOS and $O_3$. An FCVD process may also be used to form the second isolation structure 310. The FCVD process may completely fill up a deep trench such as the second trench 305 plus the third trench 309, i.e., high aspect ratio, from the bottom up, and may have a lower integration process cost because some processes of a deep trench filling may be eliminated.

The second isolation structure 310 may be used to provide isolation between adjacent active regions. The sidewall spacers 308 may also be a portion of the second isolation structure 308, which enhances the isolation between adjacent active regions.

Additionally or optionally, after depositing the second isolation material, a rapid thermal processing (RTP) process may be used to anneal all or certain structures including the first isolation structures 307, the fins 306, the second isolation structure 310, and the semiconductor substrate 300. In certain embodiment, the temperature of RTP may be approximately 1000° C., and the protective gas may be $N_2$.

The first isolate structures 307 and the second isolation structure 310 may together referred as shallow trench insolation structures (STI), the STI materials may be used as a stress controlling film to reduce the stress in the semiconductor substrate 300 caused by the fabrication processes.

Further, a chemical mechanical polishing process (CMP) may be used to polish the second isolation material using the hard mask 301 as a etch stop layer, i.e., the portion of the second isolation material on the top of the hard mask 301 may be completely polished away. The second isolation material inside the second trench 305 and the third trench 309 form the second isolation structure 310 which isolates adjacent active regions. Because the depth the second isolation structure is greater than the height of the fins 306, the second isolation structure 310 may effectively prevent the electrical connection of the adjacent Fin FETs formed in the active regions.

The second isolation material may be made of any appropriate isolation materials, such as silicon dioxide, siliconoxynitride, siliconoxycarbide, or other appropriate isolation material. In one embodiment, the isolation material is silicon dioxide.

After forming the second isolation structure 310, a CMP process or a wet etching process may be performed to remove the hard mask layer 301, a portion of the first isolation structures 307, a portion of the second isolation structure 310 and a portion of the sidewall 308. The top surface of the semiconductor substrate 300 may be used as a process stop layer. For example, when the hard mask layer 301 on the top surface of the semiconductor substrate 300 is completely removed, the CMP process or the wet etching process is stopped. When the CMP process is used, the CMP process may be an individual process or the same as the CMP process for forming the second isolation structure 310. When a wet etching process is used, the hard mask layer 301 may be removed by $H_3PO_4$, and the oxide layer may be removed by wet HF.

Further, after the CMP process, another etch back process may be performed to etch a portion of the first isolations structures 307 to expose a top portion of the fins 306, followed by forming gates on the top of the exposed fins 306 and forming source and drain regions of Fin FETs on both ends of the fins 306. Certain etching process may be used to perform the etch back process. For example, a plasma etching may be used to perform the etch back process. The etching gas may be $CF_4$ or $CHF_3$.

Therefore, a semiconductor structure is formed by the above disclosed processes and methods, as shown in FIG. 11. The semiconductor structure includes the semiconductor substrate 300 having the first region I and the second region II, and the hard mask layer 301 having a plurality of the first openings 302 over the first region I and the second opening 303 over the second region II. The semiconductor structure also includes a plurality of the first isolation structure 307 and a plurality of the fins 306. Further, the semiconductor includes the second isolation structure 310 and the side wall spacer 308. These various structures are formed by above described processes.

Thus, the disclosed method may simplify the fabrication process without forming extra hard mask layers. For example, the sidewall spacer and the first isolation structure are formed in a single step. Further, since the angle between the sloped sidewall and the surface of the semiconductor substrate may be set in a range of approximately 40°~89°, when the third trench is filled with the second isolation material, it may be less likely to form interstitial defects in the second isolation structure.

It should be understood that the specification is described by exemplary embodiments, but it is not intended to limit the scope of the present invention. Those skilled in the art, without departing the spirit and principle of the present invention, can understand the specification and make any possible alternation and modification according to the disclosed invention. Any equivalent or modification thereof falls within the true scope of the present invention.

What is claimed is:

1. A method for fabricating a semiconductor structure, comprising:
   providing a semiconductor substrate having a first region and an adjacent second region;
   etching the semiconductor substrate to form a plurality of first trenches in the first region and at least a second trench in the second region using a hard mask layer as an etching mask, the width of the second trench being greater than that of the first trench;
   filling the first trenches and the second trench using a first isolation material to form a plurality of first isolation structures in the first trenches and sidewall spacers in the second trench, respectively, within the same process;
   etching the exposed semiconductor substrate on the bottom of the second trench to form a third trench using the sidewall spacer as an etching mask; and
   filling the second trench and the third trench using a second isolation material to form a second isolation structure.

2. The method according claim 1, wherein the providing the semiconductor substrate further includes:
   forming a hard mask layer on a surface of the semiconductor substrate,
      wherein the hard mask layer over the first region has a plurality of first openings and the hard mask layer over the second region has at least one second opening, the width of the second opening is greater than the width of the first opening;
   etching the semiconductor substrate corresponding to the first openings to form the plurality of first trenches using the hard mask layer as an etching mask and fins in between the adjacent first trenches; and
   etching the semiconductor substrate corresponding to the second opening to form the second trench using the hard mask layer.

3. The method according to claim 1, wherein:
the hard mask layer is made of one of silicon nitride, siliconoxynitride, siliconoxycarbide, amorphous carbon and carbonsiliconoxynitride.

4. The method according to claim 1, wherein the forming the first isolation structures and the sidewall spacers further includes:
forming the first isolation material onto the hard mask layer to completely fill the first trenches and cover the sidewall and bottom of the second trench with the first insolation material; and
forming the first insolation structures inside the first trenches and the sidewall spacer covering the sidewall of the second trench by removing a portion of the first isolation material on the top of the hard mask layer using an etch back process.

5. The method according to claim 1, wherein:
the first isolation material is formed by silicon dioxide using an atomic layer deposition (ALD) process or a flowable chemical vapor deposition (FCVD) process.

6. The method according to claim 5, before forming the first isolation materials, further including:
performing a thermal oxidation process to form a linear layer.

7. The method according to claim 1, further including:
setting a width of the first trench in a range of 10~50 nm;
setting a depth of the first trench in a range of 50~300 nm;
setting a width of the second trench in a range of 50~500 nm;
setting a depth of the second trench in a range of 50~300 nm;
setting a width of the third trench in a range of 50~450 nm; and
setting a depth of the third trench in a range of 50~200 nm.

8. The method according to claim 1, wherein:
the sidewall of the second trench is a vertical sidewall.

9. The method according to claim 8, wherein:
the second trench is formed using a plasma etching process; and
the source power of the plasma etching process is set in a range of 550~650 W; the bias power is set in a range of 55~60 W; the pressure of the etching chamber is set in a range of 2~10 mTorr; and the etching gas are $CH_2F_2$, $SF_6$, $N_2$ and He.

10. The method according to claim 1, wherein:
the sidewall of the second trench is a sloped sidewall having an angle of 80°~89° with the semiconductor substrate.

11. The method according to claim 10, wherein:
the second trench is formed using a plasma etching process; and
the source power of the plasma etching process is set in a range of 1100~1250 W; the bias power is set in a range of 200~220 W; the pressure of the etching chamber is set in a range of 10~20 mTorr; and the etching gas are HBr, $SF_6$, and He.

12. The method according to claim 1, wherein:
the sidewall of the third trench is a sloped sidewall having an angle of 45°~89° with the surface of the semiconductor substrate.

13. The method according to claim 12, wherein:
the second trench is formed using a plasma etching process,
the source power of the plasma etching process is set in a range of 1100~1250 W; the bias power is set in a range of 200~220 W; the pressure of the etching chamber is set in a range of 10~20 mTorr; and the etching gas are HBr, $SF_6$, and He.

14. The method according to claim 1, wherein:
the second isolation structure is made of one of silicon oxide, siliconoxynitride, and siliconoxycarbide.

15. The method according to claim 13, wherein:
the second isolation structure is formed using one of a high density plasma chemical vapor deposition (HDPCVD) process, a sub-atmospheric pressure chemical vapor deposition (SACVD) process and a flowable chemical vapor deposition (FCVD) process.

16. The method according to claim 2, further including:
performing an etch back process onto the first isolation structure to expose a portion of the fins;
forming a plurality of gates on the exposed fins; and
forming a plurality of drain regions and source regions at both ends of the fins.

17. A semiconductor structure, comprising:
a semiconductor substrate having a first region and an adjacent second region;
a hard mask layer having a plurality of first opening and at least one second opening;
a plurality of first isolation structures formed inside the semiconductor substrate in the first region;
a second isolation structure formed inside the semiconductor substrate in the second region;
a plurality of fins formed in between the adjacent first isolation structures;
wherein the first isolation structures and the second isolation structure are formed by:
forming a plurality of first trenches corresponding to the first openings using the hard mask layer as an etching mask;
forming at least one second trench corresponding to the second opening using the hard mask layer as an etching mask;
filling the first trenches and the second trench using a first isolation material to form the first isolation structures in the first trenches and sidewall spacers in the second trench;
etching exposed semiconductor substrate on a bottom of the second trench using the sidewall spacer as an etching mask to form a third trench; and
filling the second trench and the third trench completely with a second isolation material to form the second isolation structure.

18. The semiconductor device according to claim 17, wherein:
the first isolation structures are made of silicon dioxide, and the second isolation structure is made of one of silicon oxide, siliconoxynitride, and siliconoxycarbide.

19. The semiconductor device according to claim 17, wherein:
the first isolation structures are formed by an ALD process, and the second isolation structure is formed by a HDP CVD process or a SACVD process.

20. The semiconductor device according to claim 17, wherein:
a plurality of gates formed on the fins; and
a plurality of drain regions and source regions formed at both ends of the fins.

* * * * *